(12) United States Patent
Hu et al.

(10) Patent No.: US 11,296,155 B2
(45) Date of Patent: Apr. 5, 2022

(54) DISPLAY PANEL AND OPERATION METHOD THEREOF

(71) Applicants: BEIJING BOE DISPLAY TECHNOLOGY CO., LTD., Beijing (CN); BOE TECHNOLOGY GROUP CO., LTD., Beijing (CN)

(72) Inventors: Weipin Hu, Beijing (CN); Qianqian Bu, Beijing (CN); Mingxiao Jiang, Beijing (CN); Zhaokun Yang, Beijing (CN); Yalong Su, Beijing (CN); Pingqi Zhang, Beijing (CN); Chenyang Zhang, Beijing (CN); Longfei Ma, Beijing (CN); Hui Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/633,181

(22) PCT Filed: Jan. 4, 2019

(86) PCT No.: PCT/CN2019/070457
§ 371 (c)(1),
(2) Date: Jan. 23, 2020

(87) PCT Pub. No.: WO2020/140279
PCT Pub. Date: Jul. 9, 2020

(65) Prior Publication Data
US 2021/0083018 A1 Mar. 18, 2021

(51) Int. Cl.
*H01L 27/32* (2006.01)
*H01L 31/0232* (2014.01)
(Continued)

(52) U.S. Cl.
CPC .... *H01L 27/3227* (2013.01); *H01L 31/02327* (2013.01); *H01L 31/125* (2013.01);
(Continued)

(58) Field of Classification Search
CPC .......... H01L 27/3227; H01L 31/02327; H01L 31/125; H01L 31/153; H01L 27/3244;
(Continued)

(56) References Cited

U.S. PATENT DOCUMENTS 8,310,738 B2 * 11/2012 Iwamoto ............... H04N 1/1135
358/481
10,679,033 B2 * 6/2020 Li ........................ G06K 9/0004
(Continued)

*Primary Examiner* — S M Sohel Imtiaz
(74) *Attorney, Agent, or Firm* — Leason Ellis LLP

(57) ABSTRACT

A display panel and an operation method thereof are disclosed. In the display panel, a second light-emitting device is configured to emit a second light ray to the non-display side, and a second photosensitive element is configured to allow the second light ray to be incident therein and detect the second light ray. A first light-emitting device and the second light-emitting device are configured to emit a first light ray to the display side, and a first photosensitive element is configured to allow the first light ray reflected by an external object to be incident therein and detect the reflected first light ray. The second light ray is of a type different from that of the first light ray.

16 Claims, 5 Drawing Sheets

(51) Int. Cl.
*H01L 31/12* (2006.01)
*H01L 31/153* (2006.01)
*G06K 9/00* (2022.01)
*G09G 5/10* (2006.01)

(52) U.S. Cl.
CPC .......... *H01L 31/153* (2013.01); *G06K 9/0004* (2013.01); *G09G 5/10* (2013.01)

(58) Field of Classification Search
CPC .. G06K 9/0004; G09G 5/10; G09G 2320/045; G09G 2320/0233; G09G 3/3208; G09G 2354/00; G09G 2320/043
See application file for complete search history.

(56) References Cited

U.S. PATENT DOCUMENTS

| | | | |
|---|---|---|---|
| 10,977,475 B2 * | 4/2021 | Jin | G06K 9/00053 |
| 2006/0256260 A1 * | 11/2006 | Gon | B23K 26/0624 |
| | | | 349/96 |
| 2010/0271566 A1 * | 10/2010 | Liao | H01L 33/38 |
| | | | 349/62 |
| 2015/0323801 A1 * | 11/2015 | Liao | G02B 30/25 |
| | | | 349/33 |
| 2018/0053032 A1 * | 2/2018 | Ding | G06K 9/0004 |
| 2018/0150670 A1 * | 5/2018 | Jang | H01L 27/323 |
| 2018/0366593 A1 * | 12/2018 | Huang | H01L 31/02164 |
| 2019/0080136 A1 * | 3/2019 | Wu | H01L 31/182 |
| 2019/0095674 A1 * | 3/2019 | Ko | G02B 6/08 |
| 2019/0096965 A1 * | 3/2019 | Mairs | H01L 27/3227 |

* cited by examiner

DISPLAY PANEL AND OPERATION METHOD THEREOF

CROSS-REFERENCE TO RELATED PATENT APPLICATIONS

This application is a U.S. National Stage Application under 35 U.S.C. § 371 of International Patent Application No. PCT/CN2019/070457, filed Jan. 4, 2019, is incorporated by reference in its entirety.

TECHNICAL FIELD

At least one embodiment of the present disclosure relates to a display panel and an operation method of the display panel.

BACKGROUND

In a display field, a display product with high screen-to-body ratio (e.g., a full screen) has a relatively high visual impact effect and an outstanding display effect, and becomes a new favorite of smart display terminals at present. However, with increase of the screen-to-body ratio, a design of modules for fingerprint identification becomes an urgent problem to be solved by mobile phone terminal manufacturers, so an under-screen fingerprint identification technology becomes a hot spot for research and development. In addition, if a light-emitting device (e.g., an organic light-emitting device) of a pixel in the display product works in a high-contrast and high-brightness state for a long time, different degrees of aging of the light-emitting device render inconsistent decay of light emission brightness of the pixel, which results in uneven light emission.

SUMMARY

At least one of embodiments in the present disclosure discloses a display panel, the display panel having a display side and a non-display side opposite to the display side, the display panel comprising at least one first pixel region and at least one second pixel region. The at least one first pixel region comprises a first light-emitting device and a first photosensitive element, the first light-emitting device and the first photosensitive element are sequentially arranged in a direction from the display side to the non-display side. The at least one second pixel region comprises a second light-emitting device and a second photosensitive element, the second light-emitting device and the second photosensitive element are sequentially arranged in the direction from the display side to the non-display side, the second light-emitting device is configured to emit a second light ray to the non-display side, and the second photosensitive element is configured to allow the second light ray to be incident therein and detect the second light ray, the first light-emitting device and the second light-emitting device are configured to emit a first light ray to the display side, and the first photosensitive element is configured to allow the first light ray reflected by an external object to be incident therein and detect the reflected first light ray; and the second light ray is of a type different from that of the first light ray.

For example, in the display panel provided by at least one of embodiments in the present disclosure, the at least one first pixel region comprises a plurality of the first light-emitting devices and the first photosensitive element; and/or the at least one second pixel region comprises a plurality of the second light-emitting devices and the second photosensitive element.

For example, in the display panel provided by at least one of embodiments in the present disclosure, the display panel comprises a plurality of the first pixel regions and a plurality of the second pixel regions, the plurality of the first pixel regions and the plurality of the second pixel regions are alternately arranged in a first direction of the display panel.

For example, in the display panel provided by at least one of embodiments in the present disclosure, the first light-emitting device comprises a first light-emitting drive upper electrode, a first light-emitting layer, and a first light-emitting drive lower electrode sequentially stacked from the display side to the non-display side; and the second light-emitting device comprises a second light-emitting drive upper electrode, a second light-emitting layer, and a second light-emitting drive lower electrode sequentially stacked from the display side to the non-display side.

For example, in the display panel provided by at least one of embodiments in the present disclosure, the second light-emitting drive lower electrode is configured as a metal grating having a second polarization direction and configured to reflect light having a first polarization direction perpendicular to the second polarization direction; and the second light ray has the second polarization direction.

For example, in the display panel provided by at least one of embodiments in the present disclosure, the second photosensitive element comprises a metal grating having the second polarization direction that is provided on a side facing towards the second light-emitting device.

For example, in the display panel provided by at least one of embodiments in the present disclosure, the first photosensitive element comprises a metal grating having the first polarization direction, the metal grating is provided on a side facing towards the first light-emitting device.

For example, in the display panel provided by at least one of embodiments in the present disclosure, the second light-emitting drive upper electrode is configured as a metal grating having the first polarization direction; and the first light ray emitted by the second light-emitting device has the first polarization direction.

For example, in the display panel provided by at least one of embodiments in the present disclosure, the first light-emitting drive upper electrode is configured as a metal grating having the first polarization direction; and the first light ray emitted by the second light-emitting device has the first polarization direction.

For example, in the display panel provided by at least one of embodiments in the present disclosure, the first light-emitting drive lower electrode is configured as a metal grating having the first polarization direction.

For example, in the display panel provided by at least one of embodiments in the present disclosure, a light ray emitted by the first light-emitting device faces away from the first photosensitive element.

For example, in the display panel provided by at least one of embodiments in the present disclosure, the at least one first pixel region comprises a display portion and a non-display portion, the first light-emitting device is located in the display portion; the first light-emitting drive lower electrode is configured as a reflective electrode; and the first photosensitive element is at least partially located in the non-display portion or overlaps with an edge of the display portion in the direction from the display side to the non-display side.

For example, in the display panel provided by at least one of embodiments in the present disclosure, the display panel further comprises a first base substrate, wherein the first light-emitting device and the second light-emitting device are located on the first base substrate; a side of the first light-emitting device and the second light-emitting device that faces away from the first base substrate is the display side.

For example, in the display panel provided by at least one of embodiments in the present disclosure, the first photosensitive element and the second photosensitive element are located on the first base substrate; or the display panel further comprises a second base substrate located on a side of the first base substrate that faces away from the first light-emitting device; the first photosensitive element and the second photosensitive element are located on the second base substrate.

For example, in the display panel provided by at least one of embodiments in the present disclosure, the display panel further comprises a first base substrate.

For example, in the display panel provided by at least one of embodiments in the present disclosure, the first light-emitting device and the second light-emitting device are located on the first base substrate; a side of the first base substrate that faces away from the first light-emitting device and the second light-emitting device is the display side.

For example, in the display panel provided by at least one of embodiments in the present disclosure, the first photosensitive element and the second photosensitive element are located on the first base substrate; or the display panel further comprises a second base substrate located on a side of the first light-emitting device that faces away from the first base substrate; the first photosensitive element and the second photosensitive element are located on the second base substrate.

For example, in the display panel provided by at least one of embodiments in the present disclosure, the first photosensitive element and the second photosensitive element comprise at least one of a photodiode and a phototransistor.

An embodiment of the present disclosure provides an operation method of the afore-mentioned display panel, comprising: in a first state, emitting light by the first light-emitting device and the second light-emitting device, and detecting the second light ray incident onto the second photosensitive element by using the second photosensitive element, the first light ray forming a display image; in a second state, emitting light by at least the second light-emitting device, and detecting the second light ray incident onto the second photosensitive element by using the second photosensitive element, the first light ray emitted by the second light-emitting device being partially incident onto the first photosensitive element after being reflected by an external object.

For example, in operation method of the display panel provided by at least one of embodiments in the present disclosure, the first light-emitting device is controlled not to emit light in the second state.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

REFERENCE SIGNS

Figure 1A:
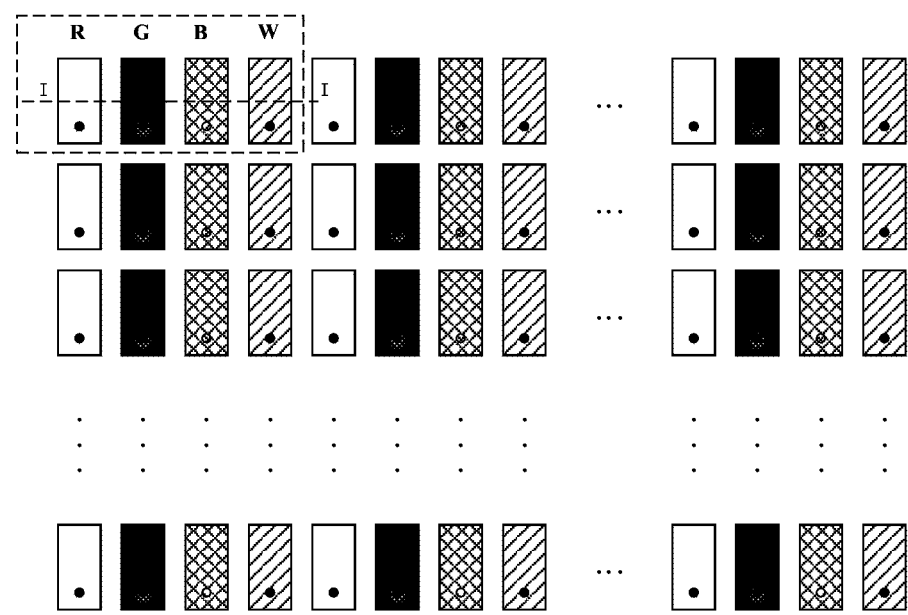
FIG. 1A is a plan view of a display panel provided by some embodiments of the present disclosure.

10—first base substrate; 20—second base substrate; 101—first pixel region; 102—second pixel region; 110—first light-emitting device; 111—first light-emitting drive upper electrode; 112—first light-emitting layer; 113—first light-emitting drive lower electrode; 120—second light-emitting device; 121—second light-emitting drive upper electrode; 122—second light-emitting layer; 123—second light-emitting drive lower electrode; 210—first photosensitive element; 211—first photosensitive drive upper electrode; 212—first photosensitive layer; 213—first photosensitive drive lower electrode; 220—second photosensitive element; 221—second photosensitive drive upper electrode; 222—second photosensitive layer; 223—second photosensitive drive lower electrode; 300—encapsulation layer; and 400—position touch structure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Generally, a pixel circuit includes a light-emitting device (e.g., an organic light-emitting diode (OLED)), a thin film transistor (TFT), and a storage capacitor, etc. For example, in a display process, the pixel circuit may switch on or off the TFT through a fixed gate scan signal, to charge a voltage corresponding to display data to the storage capacitor, and control display of a display unit through a magnitude of the voltage, to further adjust light emission brightness of the display unit.

The process stability of the TFT is always a main factor affecting a display picture of a display screen. Due to deviation in a fabrication process of the TFT, a threshold voltage Vth and mobility characteristically differ between respective driving TFTs in a plurality of pixel circuits, causing brightness deviation between respective pixels, which results in decrease in brightness uniformity of the display screen, and even generates regional spots or patterns. On the other hand, a light-emitting device made of an organic material gradually ages over time and cannot be recovered, and a light-emitting device in an emission region lit for a long time will age faster, resulting in a residual image of a display picture. Therefore, in order to solve the technical problems with respect to brightness uniformity and afterimage in the display device, a process of the thin film transistor should be improved, moreover, people also propose compensation technologies, for example, including pixel compensation (i.e., internal compensation) and external compensation.

Because pixel compensation cannot meet all backplane technologies, it is necessary to make improvement through external compensation. At present, in a large-sized display panel, the pixel circuit is usually compensated by combining electrical compensation and optical compensation, which can integrate advantages of electrical compensation and optical compensation to increase uniformity of the display panel. In general, electrical compensation may determine compensation data by sensing a voltage or a current of the pixel circuit that is acquired from a sensing signal line, to compensate the characteristics (e.g., the threshold voltage and the mobility, etc.) of the driving TFT. Optical compensation may compensate display uniformity of the entire display panel. Because optical compensation is to compensate and correct in an optical way, it may effectively compensate for display problems caused by various factors, for example, it may solve a Mura phenomenon generated in a device fabrication process; in addition, optical compensation may also be performed in real time, so that actual light emission brightness may be accurately adjusted to preset brightness.

However, with respect to a current display product having an under-screen fingerprint identification function, it is difficult to balance a real-time optical compensation function with a fingerprint identification function; moreover, in a fingerprint identification process, light reflected by a user's fingerprint will disturb actual light emission brightness of the display panel detected by a light detection device having the compensation function, in this case, the detected brightness is not the actual light emission brightness of the light-emitting device of the pixel. If brightness compensation is performed, the adjusted actual light emission brightness of the display panel deviates from the preset brightness, thereby failing to implement real-time brightness compensation. That is, in such a case, severe interference between light used for fingerprint identification and light used for brightness compensation leads to poor accuracy of fingerprint identification, and even a poor compensation effect.

At least one embodiment of the present disclosure provides a display panel. The display panel has a display side and a non-display side opposite to the display side, and comprises at least one first pixel region and at least one second pixel region. The first pixel region includes a first light-emitting device and a first photosensitive element which are sequentially arranged in a direction from the display side to the non-display side; and the second pixel region includes a second light-emitting device and a second photosensitive element which are sequentially arranged in the direction from the display side to the non-display side. The second light-emitting device is configured to emit a second light ray to the non-display side; the second photosensitive element is configured to allow the second light ray to be incident therein and detect the same; the first light-emitting device and the second light-emitting device are configured to emit a first light ray to the display side; the first photosensitive element is configured to allow the first light ray reflected by an external object to be incident therein and detect the same; and the second light ray is of a type different from that of the first light ray. For example, different types of light rays are light rays having different polarization states or having different polarization directions in a same polarization state. For example, the types of light rays include linearly polarized light, partially polarized light, circularly polarized light and elliptically polarized light, etc. For example, the second light ray and the first light ray are both linearly polarized light, but the second light ray and the first light ray have different polarization directions (e.g., directions of the second light ray and the first light ray are perpendicular to each other).

In some embodiments of the present disclosure, first light rays emitted by a first light-emitting device and a second light-emitting device are used to form a display image during normal display; undisturbed by an external object, a second light ray emitted by the second light-emitting device enters a second photosensitive element, so that the second photosensitive element at least detect actual light emission brightness of the second light-emitting device, thereby performing real-time brightness compensation on a second region. In an identification mode, when an external object (e.g., a finger, a palm, etc.) approaches, the first light ray emitted by the second light-emitting device is reflected by the finger and carries fingerprint information (brightness information) and is incident onto the first photosensitive element, so that the first photosensitive element acquires a fingerprint image for fingerprint identification. In addition, in the identification mode, the first photosensitive element and the second photosensitive element respectively receive the first light ray and the second light ray of different types, thereby reducing interference between light for fingerprint identification and light for brightness compensation, eliminating or reducing disturbance to the second photosensitive element caused by the light reflected by the external object, increasing accuracy of brightness compensation, and further increasing accuracy of fingerprint identification.

It should be noted that, the external object to be identified may be an object having dermatoglyphs, such as a finger or a palm identified through optical detection, or other type of object. In the following embodiments of the present disclosure, it is described by taking the external object to be identified as a fingerprint of a finger.

Hereinafter, a display panel and an operation method thereof according to at least one embodiment of the present disclosure will be described in conjunction with the accompanying drawings.

Figure 1B:
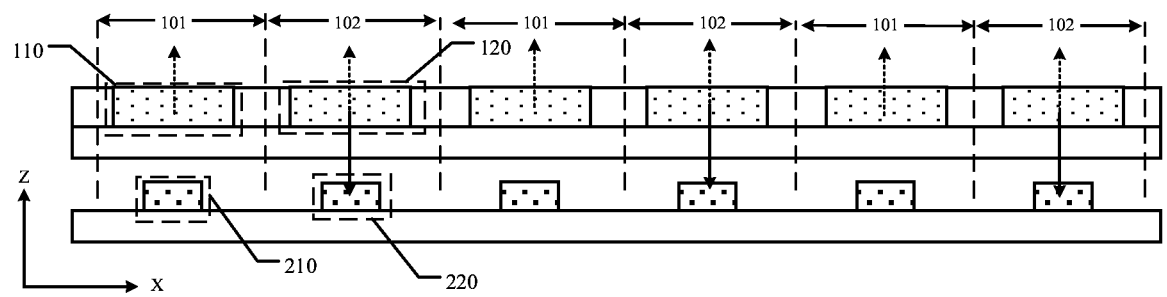
FIG. 1B is a cross-sectional view of the display panel shown in FIG. 1A along a line I-I in a state.
Figure 1C:
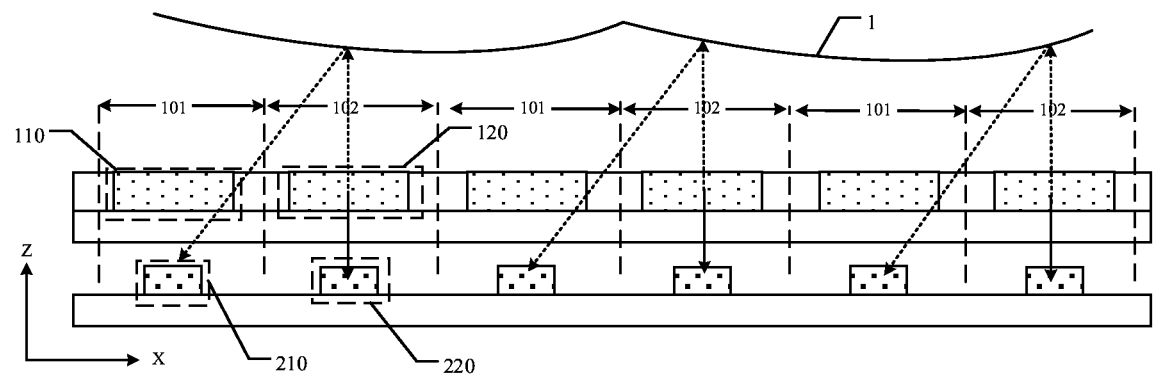
FIG. 1C is a cross-sectional view of the display panel shown in FIG. 1A along the line I-I in another state.

FIG. 1A is a plan view of a display panel provided by an embodiment of the present disclosure; FIG. 1B is a cross-sectional view of the display panel shown in FIG. 1A along a line I-I in a state; and FIG. 1C is a cross-sectional view of the display panel shown in FIG. 1A along the line I-I in another state. The display panel shown in FIG. 1B is in a display mode, and the display panel shown in FIG. 1C is in an identification mode. For example, in the display mode, a finger does not approach (e.g., not touch) a display surface of the display panel, and light emitted by all sub-pixels is used to form a display image. In the identification mode, the finger approaches (e.g., touches) the display surface of the display panel for fingerprint identification. For example, on a display side of the display panel, an encapsulation layer, optical sheets, a cover plate or other elements are arranged on a light-emitting device (e.g., a first light-emitting device 110), even if the finger has pressed on the display surface of the display panel, as shown in FIG. 1C, a fingerprint of the finger 1 and the light-emitting device are still spaced apart from each other.

At least one embodiment of the present disclosure provides a display panel, and as shown in a plan view of FIG. 1A, the display panel comprises pixel units arranged in a matrix formed by plurality of rows and a plurality of columns. For example, each pixel unit includes sub-pixels of four different colors, which are successively a red sub-pixel R, a green sub-pixel G, a blue sub-pixel B and a white sub-pixel W; and the four sub-pixels are arranged in a row. For example, each sub-pixel occupies a pixel region. Composition of each pixel unit will not be limited in the embodiment of the present disclosure, for example, each pixel unit may include a red pixel R, a green pixel G and a blue pixel B, but does not include the white pixel W; and for another example, each pixel unit may include a red pixel R, a green pixel G, a blue pixel B and a yellow pixel Y.

With further reference to FIG. 1B and FIG. 1C, the display panel has at least one first pixel region 101 and at least one second pixel region 102; the first pixel region includes a first light-emitting device 110 and a first photosensitive element 210; the second pixel region 102 includes a second light-emitting device 120 and a second photosensitive element 220. A side of the first light-emitting device 110 that faces away from the first photosensitive element 210 is a display side (an upper side in the diagram), while a side of the first photosensitive element 210 that faces away from the first light-emitting device 110 is a non-display side. A side of the second light-emitting device 120 that faces away from the second photosensitive element 220 is the display side, while and a side of the second photosensitive element 220 that faces away from the second light-emitting device 120 is the non-display side (a lower side in the diagram).

Color of lights emitted by the first pixel region 101 and the second pixel region 102 will not be limited in the embodiment of the present disclosure. Meanwhile, types and specific structures of the light-emitting element and the photosensitive element will not be limited in the embodiment of the present disclosure. For example, the light-emitting element may be an organic light-emitting element, a quantum dot light-emitting element, or the like; and the photosensitive element may be a photodiode, a phototransistor, or the like.

As shown in FIG. 1B, during normal display, the first light-emitting device 110 and the second light-emitting device 120 emit first light rays (dotted arrows "↑") to form a display image, so that a user located on the display side views the display image. At the same time, a second light ray (the solid arrows "↑") emitted by the second light-emitting device 120 enters the second photosensitive element 220 to perform brightness compensation. As shown in FIG. 1C, in an identification mode, the user's finger 1 approaches the display panel, for example, touches a surface of the display panel on the display side, the second light ray emitted by the second light-emitting device 120 enters the second photosensitive element 220 to perform brightness compensation; at the same time, the first lights ray emitted by the first light-emitting device 110 and the second light-emitting device 120 are reflected by the fingerprint of the finger 1 and enters the first photosensitive element 210, and the first photosensitive element 210 detects brightness of the first light rays for fingerprint identification.

A display surface of the display panel has a display region for displaying an image, and at least a portion of the display region may be taken as a fingerprint identification region. For example, in some embodiments of the present disclosure, a whole display region of a display panel is taken as a fingerprint identification region, and the whole display region is composed of first pixel regions 101 and second pixel regions 102 as shown in FIG. 1B and FIG. 1C, for example, the first pixel regions 101 and the second pixel regions 102 are evenly distributed in the display region of the display panel, so that the display panel has a full-screen fingerprint identification and brightness compensation function. For example, in other embodiments of the present disclosure, a portion of a display region of a display panel is taken as a fingerprint identification region, and the fingerprint identification region is composed of first pixel regions 101 and second pixel regions 102 as shown in FIG. 1B and FIG. 1C. For example, the first pixel regions 101 and the second pixel regions 102 are evenly distributed in the fingerprint identification region, so that the fingerprint identification region of the display panel has a fingerprint identification and brightness compensation function. For example, in an identification mode, with respect to a region not covered by the finger 1, the first pixel regions and the second pixel regions in the region may display an image as shown in FIG. 1B.

For example, a display panel provided by at least one embodiment of the present disclosure comprises a plurality of first pixel regions and a plurality of second pixel regions; and the plurality of first pixel regions and the plurality of second pixel regions are alternately arranged in a first direction of the display panel. Exemplarily, as shown in FIG. 1A to FIG. 1C, the first pixel regions 101 and the second pixel regions 102 are alternately arranged in the first direction (e.g., an X-axis direction). For example, every first pixel region 101 and every second pixel region 102 adjacent to each other constitute a group; in an identification mode, the first light ray emitted by the second pixel region 102 is reflected by the finger 1 and then incident onto the first photosensitive element 210 of the same group (referring to the related description of the embodiment shown in FIG. 3), but substantially not incident onto the first photosensitive element 210 of other groups, thereby preventing the first light ray reflected at different positions of the finger 1 from entering the same first photosensitive element 210 to cause crosstalk in fingerprint identification.

In at least one embodiment of the present disclosure, correspondence between the number of photosensitive elements (first photosensitive elements, second photosensitive elements) and the number of light-emitting devices (first light-emitting devices, second light-emitting devices) will not be limited. Each photosensitive element may correspond to one light-emitting device, or may also correspond to a plurality of light-emitting devices.

For example, in some embodiments of the present disclosure, as shown in FIG. 1A and FIG. 1B, the first pixel region 101 includes one first light-emitting device 110 and one first photosensitive element 210, and the second pixel region 102 includes one second light-emitting device 210 and one second photosensitive element 220, that is, the first pixel region 101 and the second pixel region 102 respectively correspond to one sub-pixel. In this way, the display panel according to these embodiments has high accuracy of fingerprint identification, and each photosensitive element (e.g., the second photosensitive element; or a first photosensitive element and a second photosensitive element according to the embodiment shown in FIG. 2A) may be used to detect light emission brightness of one sub-pixel, and increase a brightness compensation effect.

For example, in a display panel provided by other embodiments of the present disclosure, a first pixel region includes a plurality of first light-emitting devices and one first photosensitive element, and/or a second pixel region includes a plurality of second light-emitting devices and one second photosensitive element, that is, the first pixel region and/or the second pixel region correspond to a plurality of sub-pixels. In the display panel according to these embodiments, some regions of the display panel has poor light emission due to its fabrication process, and every defective region usually includes several sub-pixels. In a fingerprint identification region, even if the number of photosensitive elements for fingerprint identification is smaller than the number of sub-pixels, a fingerprint image can also be acquired for fingerprint identification, because an area of a fingerprint is larger than an area of a sub-pixel. In this way, with respect to the region where several sub-pixels are located, brightness or sufficient fingerprint information can be detected by a single photosensitive element, so the number of photosensitive elements (first photosensitive elements, second photosensitive elements) is smaller, which simplifies a structure of the display panel and reduces costs.

Hereinafter, by taking the case where the sub-pixels (e.g., the photosensitive elements therein) are in one-to-one correspondence with the light-emitting devices shown in FIG. 1A and FIG. 1B as an example, the technical solution of at least one of following embodiments of the present disclosure will be described.

For example, as shown in FIG. 1C, in an identification mode, a first light-emitting device 110 in a region covered by the fingerprint is turned off, so as to prevent the first light-emitting device 110 from emitting a light ray that disturbs fingerprint identification. If the first light-emitting device 110 is turned on, the light ray emitted thereby will be reflected by the fingerprint and incident onto a first photosensitive element 210, so that the first photosensitive element 210 receives light rays reflected at different positions of the fingerprint which disturb fingerprint identification. In addition, the light ray reflected by the fingerprint may be incident onto a second photosensitive element 220 in an adjacent sub-pixel, which disturbs brightness detection of the second light-emitting device 120 performed by the second photosensitive element 220 (e.g., the detected brightness value is relatively high). After brightness compensation is performed, the actual light emission brightness of the second light-emitting device 120 is adjusted to a brightness which deviates from preset brightness (e.g., the actual light emission brightness is relatively small), that is, the brightness of a first light ray emitted by the second light-emitting device 220 for fingerprint identification is adjusted to a brightness which deviates from a preset value, resulting in poor accuracy of fingerprint identification.

Figure 2A:
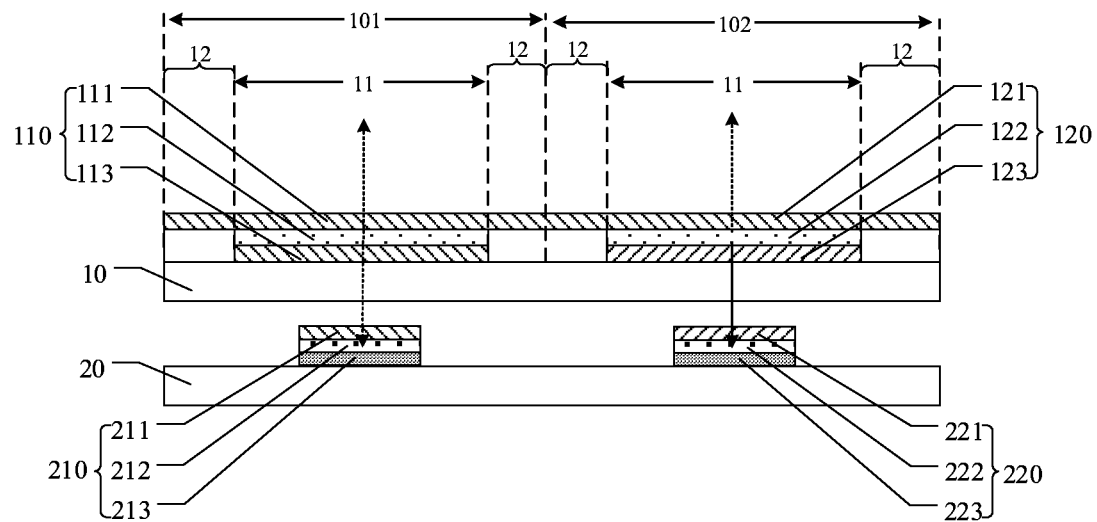
FIG. 2A is a partial cross-sectional view of a display panel in a state provided by some embodiments of the present disclosure.
Figure 2B:
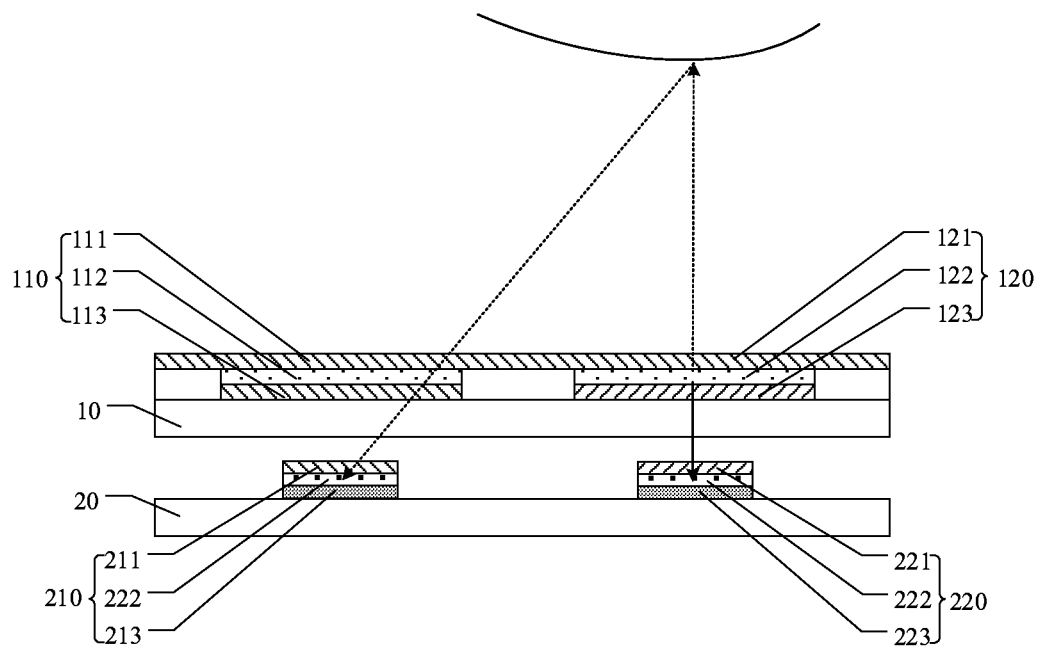
FIG. 2B is a partial cross-sectional view of a display panel in a state provided by some embodiments of the present disclosure.

FIG. 2A is a partial cross-sectional view of a display panel in a state provided by an embodiment of the present disclosure; and FIG. 2B is a partial cross-sectional view of a display panel in a state provided by an embodiment of the present disclosure; which, for example, respectively correspond to the display panel shown in FIG. 1B and the display panel shown in FIG. 1C. The display panel shown in FIG. 2A is in a display mode, and the display panel shown in FIG. 2B is in an identification mode.

For example, in a display panel provided by at least one embodiment of the present disclosure, a first light-emitting device includes a first light-emitting drive upper electrode, a first light-emitting layer and a first light-emitting drive lower electrode sequentially stacked from a display side to a non-display side; and a second light-emitting device includes a second light-emitting drive upper electrode, a second light-emitting layer and a second light-emitting drive lower electrode sequentially stacked from the display side to the non-display side.

Exemplarily, as shown in FIG. 2A and FIG. 2B, a first light-emitting device 110 includes a first light-emitting drive upper electrode 111, a first light-emitting layer 112 and a first light-emitting drive lower electrode 113 stacked from the display side to the non-display side; and a second light-emitting device 120 includes a second light-emitting drive upper electrode 121, a second light-emitting layer 122 and a second light-emitting drive lower electrode 123 stacked from the display side to the non-display side. For example, the light-emitting device (the first light-emitting device 110, the second light-emitting device 120) may be an organic light-emitting device or a quantum dot light-emitting device; the light-emitting layer (the first light-emitting layer 112, the second light-emitting layer 122) may be an organic light-emitting layer or a quantum dot light-emitting layer; one of the light-emitting drive upper electrode (the first light-emitting drive upper electrode 111, the second light-emitting drive upper electrode 121) and the light-emitting drive lower electrode (the first light-emitting drive lower electrode 113, the second light-emitting drive lower electrode 123) is an anode, and the other is a cathode.

For example, according to the type of the display panel, the light-emitting device (the first light-emitting device, the second light-emitting device) may be an organic light-emitting diode (OLED) light-emitting device or a quantum dot light-emitting diode (PLED) light-emitting device, etc. For example, the light-emitting layer (the first light-emitting layer, the second light-emitting layer) of the light-emitting device is configured to emit light of different colors, for example, red light, green light, blue light, yellow light and white light, etc. For example, light-emitting layers of light-emitting devices in a plurality of pixel regions are integrated together to emit light of a same color, for example, white light, blue light, yellow light, or light of other color.

For example, light emitted by the light-emitting layer of the light-emitting device is natural light, and the natural light may be converted into polarized light after passing through a structure other than the light-emitting layer of the light-emitting device. The first light ray or the second light ray as described above is only a component of the natural light in one direction; for convenience of description, the light emitted by the light-emitting layer is divided into the first light ray and the second light ray, and a light ray actually used for display is composed of two components including the first light ray and the second light ray.

For example, in a display panel provided by at least one embodiment of the present disclosure, for example, a photosensitive element may be a photodiode, for example, a PIN-type photodiode, a PN-type photodiode, or other type of photodiode; or the photosensitive element may be a phototransistor. As shown in FIG. 2A and FIG. 2B, a first photosensitive element 210 and a second photosensitive element 220 are, for example, PN-type or PIN-type photodiodes. The first photosensitive element 210 includes a first photosensitive drive upper electrode 211, a first photosensitive layer 212 and a first photosensitive drive lower electrode 213 sequentially stacked from a display side to a non-display side (i.e., from an upper side to a lower side in the diagram); and the second photosensitive element 220 includes a second photosensitive drive upper electrode 221, a second photosensitive layer 222 and a second photosensitive drive lower electrode 223 sequentially stacked from a display side to a non-display side (i.e., from an upper side to a lower side in the diagram). Photosensitive layers (a first photosensitive layer 212 and a second photosensitive layer 222) may include a semiconductor material; the semiconductor material may be a silicon material; under light irradiation, the photosensitive layers generate a photo-charge, the photo-charge may be converted into an electrical signal (a voltage signal or a current signal), and brightness of a first light ray incident onto the photosensitive element can be detected through the electrical signal.

For example, in a display panel provided by at least one embodiment of the present disclosure, a second light-emitting drive lower electrode is configured as a metal grating having a second polarization direction, so as to transmit light having the second polarization direction and reflect light having a first polarization direction perpendicular to the second polarization direction; and thus, a first light ray emitted toward a display side has the first polarization direction, and a second light ray emitted toward a non-display side has the second polarization direction. Exemplarily, as shown in FIG. 2A and FIG. 2B, the second light-emitting drive lower electrode 123 is set as the metal grating having the second polarization direction. Thus, in a second pixel region 102, the second light ray has the second polarization direction; the first light ray reflected by the second light-emitting drive lower electrode 123 has the first polarization direction perpendicular to the second polarization direction; and the first light ray reflected by a fingerprint cannot pass through the second light-emitting drive lower electrode 123, but is incident onto a second photosensitive element 220. Therefore, in an identification mode, the first light ray does not disturb detection of the second photosensitive element, so the second photosensitive element can detect actual light emission brightness of a second light-emitting device 120 without being affected by reflected light, which, thus, ensures real-time brightness compensation.

Based on the above-described circumstances, in at least one embodiment of the present disclosure, as long as a second photosensitive drive upper electrode of a second photosensitive element can transmit light, the second photosensitive element can detect light emission brightness of a second light-emitting device, so as to implement brightness compensation. For example, the second photosensitive drive upper electrode may be a transparent or translucent electrode, an electrode provided with a via hole, or a metal grating, etc.

For example, in a display panel provided by at least one embodiment of the present disclosure, a second photosensitive element includes a metal grating having a second polarization direction that is provided on a side of the second photosensitive element facing a second light-emitting device. For example, the metal grating may be used as a second photosensitive drive upper electrode of the second photosensitive element. Exemplarily, as shown in FIG. 2A and FIG. 2B, the second photosensitive drive upper electrode 221 is the metal grating having the second polarization direction. Thus, a second light ray having the second polarization direction transmitted through a second light-emitting drive lower electrode 123 will not be absorbed and will not be reduced in brightness when passing through the second photosensitive drive upper electrode 221, so that the second photosensitive element 220 has high detection accuracy. For example, a second photosensitive drive lower electrode 223 may be set as a reflective electrode, so as to reflect the second light ray transmitted through a second photosensitive layer 222 back to the second photosensitive layer 222, thereby increasing a utilization rate of the second light ray incident onto the second photosensitive element 220, and increasing detection accuracy of the second photosensitive element 220.

In at least one embodiment of the present disclosure, a first light ray emitted by a second light-emitting device is reflected by a fingerprint and then carries fingerprint information (brightness). As long as a first photosensitive drive upper electrode of a first photosensitive element can transmit light, the first light ray carrying the fingerprint information may be incident onto the first photosensitive element, so that the first photosensitive element may acquire a fingerprint image for implementing fingerprint identification. For example, a second photosensitive drive upper electrode may be a transparent or translucent electrode, an electrode provided with a via hole, or a metal grating.

For example, in a display panel provided by at least one embodiment of the present disclosure, a first photosensitive element includes a metal grating having a first polarization direction, the metal grating is provided on a side facing a first light-emitting device. For example, the metal grating is taken as a first photosensitive drive upper electrode of the first photosensitive element. Exemplarily, as shown in FIG. 2A and FIG. 2B, the first photosensitive drive upper electrode 211 is the metal grating having the first polarization direction. Thus, while first light rays emitted by the first light-emitting device 110 and a second light-emitting device 120 are reflected by a fingerprint and incident toward the first photosensitive element, the light rays will not be absorbed and will not be reduced in brightness when passing through the first photosensitive drive upper electrode 211, that is, the first light ray has high transmittance in a process when it is reflected from the fingerprint to a first photosensitive layer 212, thereby increasing detection accuracy of the first photosensitive element 210. For example, a first photosensitive drive lower electrode 213 may be set as a reflective electrode, so as to reflect the first light ray transmitted from the first photosensitive layer 212 back to the first photosensitive layer 212, thereby increasing a utilization rate of the first light ray incident onto the first photosensitive element 210, and increasing detection accuracy of the first photosensitive element 210.

For example, in a display panel provided by at least one embodiment of the present disclosure, a second light-emitting drive upper electrode is configured as a metal grating having a first polarization direction; and a first light ray emitted by a second light-emitting device has the first polarization direction. Exemplarily, as shown in FIG. 2A and FIG. 2B, a second light-emitting drive lower electrode 123 is set as a metal grating having a second polarization direction, and the second light-emitting drive upper electrode 121 is set as the metal grating having the first polarization direction. Thus, light emitted by the second light-emitting device 120 toward a non-display side (a second light ray) all has the second polarization direction, and light emitted by the second light-emitting device 120 toward a display side (the first light ray) all has the first polarization direction, that is, light emitted by the second light-emitting device 120 and reflected by a fingerprint cannot pass through the second light-emitting drive lower electrode 123 to enter a second photosensitive element 220. Thus, in an identification mode, disturbance to the second photosensitive element 220 caused by the light ray emitted by the second light-emitting device 120 toward the display side can be eliminated, thereby increasing accuracy detection of light emission brightness of the second light-emitting device 120 performed by the second photosensitive element 220, increasing accuracy of brightness compensation, and further increasing accuracy of fingerprint identification.

For example, in a display panel provided by at least one embodiment of the present disclosure, a first light-emitting drive upper electrode is configured as a metal grating having a first polarization direction; and a first light ray emitted by a second light-emitting device has the first polarization direction. Exemplarily, as shown in FIG. 2A and FIG. 2B, the first light-emitting drive upper electrode 111 is set as the metal grating having the first polarization direction. Thus, in an identification mode, the first light ray reflected by a fingerprint and incident onto a first photosensitive element 210 not only pass through a gap between pixel regions, but also can wholly pass through the first light-emitting drive upper electrode 111 so as to enter the first photosensitive element 210, thereby increasing transmittance of the first light ray, and increasing detection accuracy of the first photosensitive element 210.

For example, as shown in FIG. 2A and FIG. 2B, the first light-emitting drive upper electrode and a second light-emitting drive upper electrode may be set as an integrated electrode to serve as a common electrode (e.g., a common cathode) of the first light-emitting device and the second light-emitting device. For example, the common electrode includes a wire gating in a portion where the common electrode overlaps with a light-emitting layer (e.g., in a display portion 11), and further includes a hollow region (an opening) in other portion (e.g., in a non-display portion 12) to allow the reflected first light ray to enter, which simplifies a fabrication process of the display panel, and reduces costs.

For example, in a display panel provided by some embodiments of the present disclosure, a first light-emitting drive lower electrode is configured as a metal grating having a first polarization direction. Exemplarily, as shown in FIG. 2A and FIG. 2B, a first light-emitting drive lower electrode 113 of a first light-emitting device 110 is set as the metal grating having the first polarization direction. Thus, in an identification mode, a first light ray reflected by a fingerprint and incident onto a first photosensitive element 210 is wholly transmitted without being absorbed and reduced in brightness, when passing through the first light-emitting drive lower electrode 113, so that transmittance of the first light ray is high in a process when it is reflected by the fingerprint to a first photosensitive layer 212, thereby increasing detection accuracy of the first photosensitive element 210. In addition, in a display mode, the first light-emitting device 110 emits a first light ray having the first polarization direction toward a non-display side, so that the first photosensitive element 210 can monitor light emission brightness of the first light-emitting device 110 in real time, and can perform brightness compensation on the first light-emitting device 110 accordingly. Thus, in the display mode, brightness compensation is performed on all sub-pixels of the display panel, thereby increasing a display effect of the display panel.

For example, as shown in FIG. 2A and FIG. 2B, in a case where the first light-emitting drive lower electrode 113 is set as the metal grating having the first polarization direction, the first photosensitive element 210 is set to overlap with the first light-emitting device 110, which, in the display mode, can increase luminous flux of the first light ray entering the first photosensitive element 210 from the first light-emitting device 110, and increase detection accuracy of the first photosensitive element 210. For example, with respect to a first pixel region 101 and a second pixel region 102 of each group, a position of a first photosensitive element 210 is closer to a second pixel region 102 of a same group, that is, a first photosensitive element 210 has a smaller distance to a second pixel region 102 of a same group than a distance to a second pixel region 102 of other group, which, in the identification mode, can prevent a first light ray emitted by a second light-emitting device and reflected by the fingerprint from being incident onto a first photosensitive element of other group to cause disturbance, so as to increase accuracy of fingerprint identification.

Figure 3:
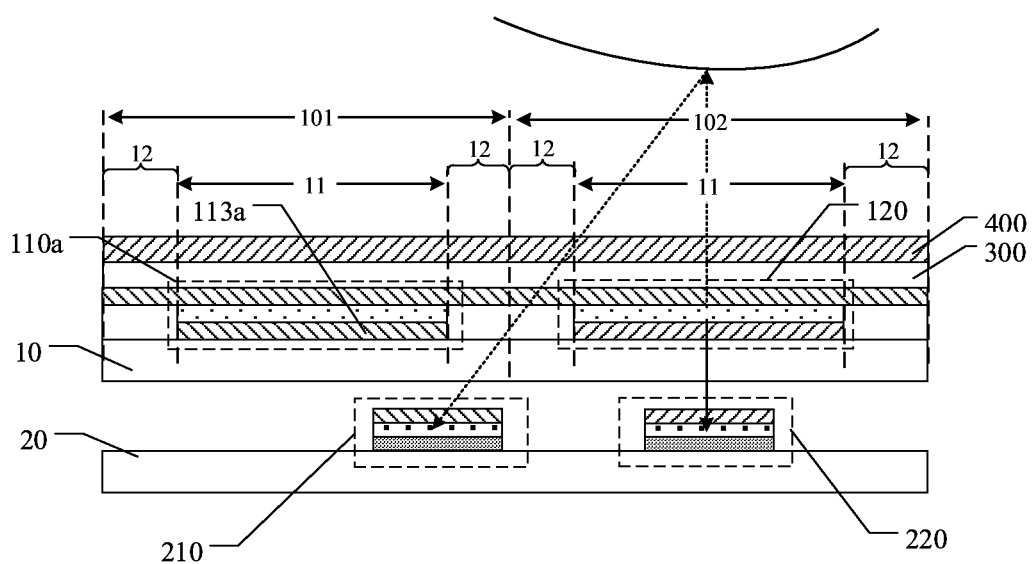
FIG. 3 is a partial cross-sectional view of another display panel provided by some embodiments of the present disclosure.

FIG. 3 is a partial cross-sectional view of another display panel provided by an embodiment of the present disclosure; and the display panel is in an identification mode.

For example, in other embodiments of the present disclosure, light emitted by a first light-emitting device faces away from a first photosensitive element. Exemplarily, as shown in FIG. 3, a first light-emitting drive lower electrode 113a of the first light-emitting device 110a is set as a reflective electrode, and the first light-emitting device 110a emits light only toward the display side, so that in a case of displaying an image, the first light-emitting device 110a has high utilization rate of light.

For example, in a display panel provided by at least one embodiment of the present disclosure, a first pixel region includes a display portion and a non-display portion; a first light-emitting device is located in the display portion; and in a case where light emitted by the first light-emitting device faces away from a first photosensitive element, a first light-emitting drive lower electrode is configured as a reflective electrode; and the first photosensitive element is at least partially located in the non-display portion or overlaps with an edge of the display portion in a direction from a display side to a non-display side. Exemplarily, as shown in FIG. 3, a pixel region (a first pixel region 101, a second pixel region 102) includes a display portion 11 and a non-display portion 12; a first light-emitting device 110a is located in the display portion 11 of the first pixel region 101; and a second light-emitting device 120 is located in the display portion 11 of the second pixel region 102. The first light-emitting drive lower electrode 113a is configured as a reflective electrode; and a portion of the first photosensitive element 210 is located in the non-display portion 12 of the first pixel region 101. Thus, after the first light ray emitted by the second light-emitting device 120 is reflected by a fingerprint, it is incident onto the first photosensitive element 210 in an oblique direction without being shielded by the first light-emitting drive lower electrode 113*a*. The non-display portion 12 of the pixel region is usually provided with a signal line, such as a gate line and a data line; and there may be a gap between signal lines so that light may pass through the non-display portion 12.

It should be noted that, in at least one embodiment of the present disclosure, when driving electrodes of a photosensitive element and a light-emitting device are set as metal gratings, the driving electrodes may be entirely composed of the metal gratings, or the driving electrodes may include a laminated layer composed of the metal gratings and a transparent electrode.

The metal grating (a wire grating polarizer) may be a plurality of fine metal wires arranged at equal intervals; the plurality of fine metal wires are parallel to each other; light emitted by a light source (e.g. a backlight source) includes light rays that vibrate in various directions, herein, a light ray with a vibration direction parallel to a direction of the metal grating can pass through a gap between the fine metal wires and form polarized light; a light ray with a vibration direction perpendicular to the metal wire grating cannot pass through the gap between the fine metal wires and is reflected on a surface of the metal wire grating polarizer. For example, the fine metal wire has a width from 50 nm to 60 nm, a thickness (a height) from 100 nm to 170 nm, and an arrangement cycle (a sum of a distance between adjacent fine metal wires and a width of one fine metal wire) from 90 nm to 150 nm.

For example, in some embodiments, one of a first light ray and a second light ray is TE light and the other is TM light. For example, in other embodiments, one of a first light ray and a second light ray is S light, and the other is P light. Exemplarily, the first light ray is S light and the second light ray is P light. For example, in at least one embodiment of the present disclosure, in a case where a first light ray is TE light and a second light ray is TM light, the TE light has a first polarization direction, the TM light has a second polarization direction, and the first polarization direction is perpendicular to the second polarization direction.

For example, in at least one embodiment of the present disclosure, a display panel comprises a control circuit, for example, a control chip. A first pixel region is provided with a first light emission drive circuit that drives light emission brightness of a first light-emitting device, and a first photosensitive drive circuit that drives a first photosensitive element. A second pixel region is provided with a second light emission drive circuit that drives light emission brightness of a second light-emitting device, and a second compensation drive circuit that drives a second photosensitive element. The control chip is electrically connected with the first light emission drive circuit and the second light emission drive circuit, and may further be in signal communication with the first photosensitive drive circuit and the second photosensitive drive circuit, to send an electrical signal reflecting light emission brightness of the light-emitting device, receive an electrical signal reflecting fingerprint information, and control the first light emission drive circuit and the second light emission drive circuit to perform brightness compensation on the first light-emitting device and the second light-emitting device.

For example, the control chip is a central processor, a digital signal processor, a single chip microcomputer, a programmable logic controller, or the like. For example, a driver chip may further include a memory, further include a power supply module, etc., moreover, a conductor and a signal line are provided for implement functions of power supply as well as signals input and output. For example, the driver chip may further include a hardware circuit and computer executable codes, etc. The hardware circuit may include a conventional very large scale integration (VLSI) circuit or a gate array, as well as an existing semiconductor such as a logic chip and a transistor, or other discrete elements; and the hardware circuit may further include a field programmable gate array, a programmable array logic, and a programmable logic device, etc.

For example, in at least one embodiment of the present disclosure, when a display panel detects that there is a user's finger approaching, the display panel is switched to an identification mode; and according to a position of the finger, a first light-emitting device in a region where the finger is located is turned off to prevent the first light-emitting device from emitting a light ray that disturbs fingerprint identification.

For example, in some embodiments of the present disclosure, a first photosensitive element is also used to detect whether a display panel is touched so as to determine a touched position and a region where a fingerprint is located. In a display mode, no light ray (first light ray) is incident onto the first photosensitive element; and in an identification mode, a portion of a light ray emitted by a second light-emitting device will be reflected by the fingerprint to a first photosensitive element of a same group; according to a detection result, it can be determined that a second pixel region is covered by the fingerprint, and a position and an area of the fingerprint can be determined according to all of the second pixel region that is covered by the fingerprint.

For example, in other embodiments of the present disclosure, as shown in FIG. 3, a display panel further comprises a position touch structure 400. For example, the position touch structure 400 includes a plurality of touch units. The position touch structure is used to detect whether the display panel is touched as well as a touched position, and determine a region where a fingerprint is located. For example, a type of the position touch structure may include a resistive type, a capacitive type, an infrared type, an acoustic wave type, or other type. For example, a position touch structure of a capacitive type may include a self-capacitive type and a mutual-capacitive type. In a case where an external object (e.g., a finger) approaches, a capacitance value of a capacitive type touch unit changes; and thus, the touch position of a display substrate may be detected. A specific type and a structure of the position touch structure will not be limited in the embodiment of the present disclosure. In at least one embodiment of the present disclosure, a position touch structure can be used to detect whether a display panel is touched; and if it is touched, the display panel is switched to an identification mode, so as to acquire a fingerprint image for fingerprint identification.

In at least one embodiment of the present disclosure, the arrangement of a position touch structure in a display panel will not be limited. For example, in some embodiments of the present disclosure, a position touch structure is attached to a display side of a display panel. For example, in other embodiments of the present disclosure, in a fabrication process of a display panel, a position touch structure is formed on a display side of the display panel in a non-adhesive manner such as deposition and patterning; for example, as shown in FIG. 3, a light-emitting device is covered by a encapsulation layer 300, and a position touch structure 400 (e.g. a touch electrode) is directly formed on a surface of the encapsulation layer 300.

In at least one embodiment of the present disclosure, a light-emitting device and a photosensitive element may be arranged on one substrate, or may also be respectively arranged on different substrates; a light emission mode of a display panel (a light-emitting device therein) for displaying an image may be set to top emission, or may also be set to bottom emission; and a display side and a non-display side of the display panel, and positional relationships between the photosensitive element and the light-emitting device may be determined according to the light emission mode.

For example, in some embodiments of the present disclosure, a light emission mode of a display panel is top emission. As shown in FIG. 3, the display panel further comprises a first base substrate 10 and a second base substrate 20, a first light-emitting device 110a and a second light-emitting device 120 is located on the first base substrate 10. A side of the first light-emitting device 110a and the second light-emitting device 120 that faces away from the first base substrate 10 is a display side. The second base substrate 20 is located on a side of the first base substrate 10 that faces away from the first light-emitting device 110a. A first photosensitive element 210 and a second photosensitive element 220 are located on the second base substrate 20. For example, the first photosensitive element 210 and the second photosensitive element 220 are located on a side of the second base substrate 20 that faces towards the first base substrate 10, or may also be located on a side of the second base substrate 20 that faces away from the first base substrate 10.

Figure 4:
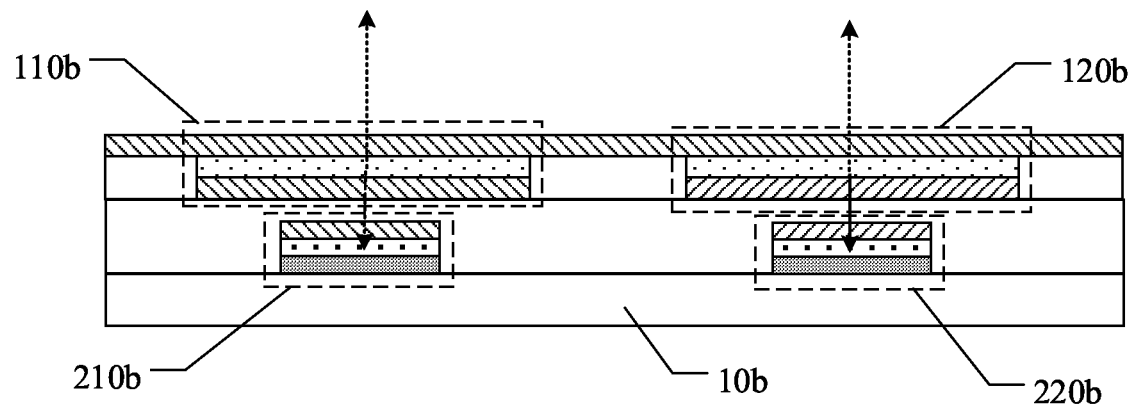
FIG. 4 is a partial cross-sectional view of another display panel provided by some embodiments of the present disclosure.

FIG. 4 is a partial cross-sectional view of another display panel provided by an embodiment of the present disclosure; and the display panel is in a display mode.

For example, in other embodiments of the present disclosure, a light emission mode of a display panel is top emission. As shown in FIG. 4, the display panel further comprises a first base substrate 10b. A first light-emitting device 110b, a second light-emitting device 120b, a first photosensitive element 210b and a second photosensitive element 220b are all located on the first base substrate 10b. A side of the first light-emitting device 110b and the second light-emitting device 120b that faces away from the first base substrate 10b is a display side. Thus, in a fabrication process of the display panel, it is only necessary to perform a fabrication process of the photosensitive elements and the light-emitting devices on the first base substrate 10b, which simplifies a structure and a fabrication process of the display panel, and facilitates lightening and thinning of the display panel; in addition, such a configuration facilitates alignment of a photosensitive element and an organic light-emitting device (a sub-pixel), and increases a defect-free ratio of the display panel.

For example, a display panel provided by at least one embodiment of the present disclosure further comprises a first base substrate; a first light-emitting device and a second light-emitting device are located on the first base substrate; and a side of the first light-emitting device and the second light-emitting device that faces away from the first base substrate is a display side.

Figure 5:
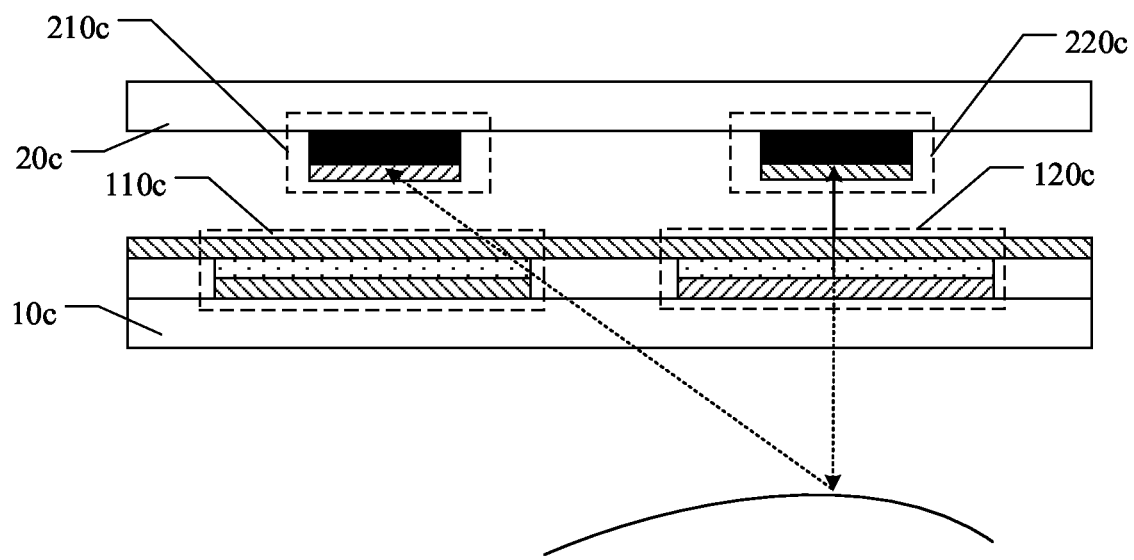
FIG. 5 is a partial cross-sectional view of another display panel provided by some embodiments of the present disclosure.

FIG. 5 is a partial cross-sectional view of another display panel provided by an embodiment of the present disclosure; and the display panel is in an identification mode.

For example, in other embodiments of the present disclosure, a light emission mode of a display panel is bottom emission. As shown in FIG. 5, the display panel further comprises a first base substrate 10c and a second base substrate 20c. A first light-emitting device 210c and a second light-emitting device 220c are located on the first base substrate 10c. A side of the first base substrate 10c that faces away from the first light-emitting device 110c and the second light-emitting device 120c is a display side. The second base substrate 20c is located on a side of the first base substrate 10c that faces away from the first light-emitting device 110c; and a first photosensitive element 210c and a second photosensitive element 220c are located on the second base substrate 20c. For example, the first photosensitive element 210c and the second photosensitive element 220c are located on a side of the second base substrate 20c that faces towards the first base substrate 10c, or located on a side of the second base substrate 20c that faces away from the first base substrate 10c.

Figure 6:
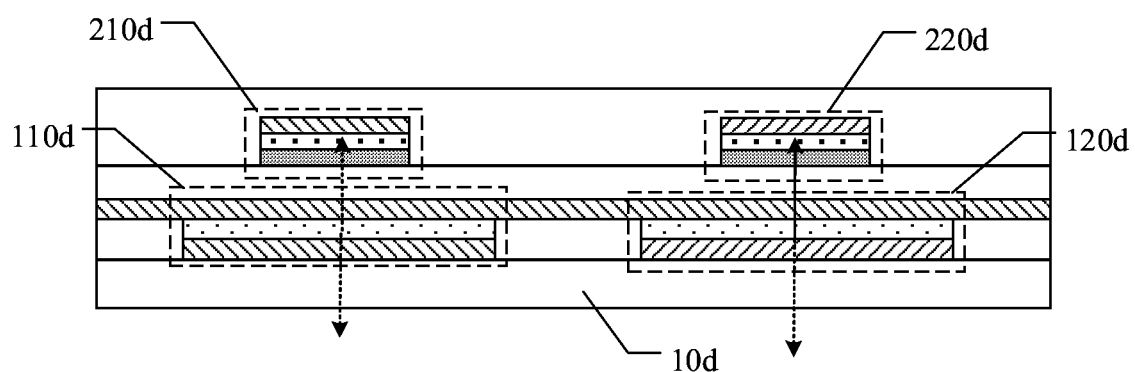
FIG. 6 is a partial cross-sectional view of another display panel provided by some embodiments of the present disclosure.

FIG. 6 is a partial cross-sectional view of another display panel provided by an embodiment of the present disclosure; and the display panel is in a display mode.

For example, in other embodiments of the present disclosure, a light emission mode of a display panel is bottom emission. As shown in FIG. 6, the display panel further comprises a first base substrate 10d. A first light-emitting device 110d, a second light-emitting device 120d, a first photosensitive element 210d and a second photosensitive element 220d are all located on the first base substrate 10d. A side of the first light-emitting device 110d and the second light-emitting device 120d that faces towards the first base substrate 10d is a display side. Thus, in a fabrication process of the display panel, it is only necessary to perform a fabrication process of the photosensitive elements and the light-emitting devices on the first base substrate 10d, which simplifies a structure and a fabrication process of the display panel, and facilitates lightening and thinning of the display panel; in addition, such a configuration facilitates alignment of a photosensitive element and an organic light-emitting device (a sub-pixel), and increases a defect-free ratio of the display panel.

In the above-described embodiments, the first base substrate and the second base substrate may be transparent substrates or non-transparent substrates according to needs, which may be, for example, glass substrates, plastic substrates, or the like.

In at least one embodiment of the present disclosure, a display panel may further comprise optical sheets such as a color filter and a polarizing layer located on a display side. For example, the polarizing layer constitutes a circular polarizer. The circular polarizer includes a linear polarizing layer and a quarter wave plate stacked. The linear polarizing layer is located on the display side. An angle between an axis of the quarter wave plate and a polarization axis of the linear polarizing layer is 45 degrees. When external light passes through the circular polarizer, it is converted into circularly polarized light; after the circularly polarized light is reflected back by an electrode in the display panel, it is converted into linearly polarized light again after passing through the quarter wave plate for a second time. However, the linearly polarized light has a polarization direction that differs from the polarization axis of the linear polarizing layer by 90 degrees, and cannot pass through the linear polarizing layer. Therefore, the polarizing layer can absorb external light incident onto the display substrate, thereby reducing disturbance by external ambient light and increasing contrast of a display image of the display substrate. The color filter can absorb a portion of the ambient light, to reduce disturbance by the ambient light to the display image; in addition, with respect to a display panel having a light-emitting device that emits white light, the color filter causes sub-pixels of the display panel to emit colored light so as to display a color image.

In at least one embodiment of the present disclosure, a display panel may be a television, a digital camera, a mobile phone, a watch, a tablet personal computer, a laptop, a navigator, and any other product or component having a display function.

At least one embodiment of the present disclosure provides an operation method of a display panel, comprising: in a first state, emitting light by a first light-emitting device and a second light-emitting device, and detecting the second light ray incident onto the second photosensitive element by using a second photosensitive element by using a second photosensitive element, a first light ray forming a display image; in a second state, emitting light by at least the second light-emitting device, and detecting the second light ray incident onto the second photosensitive element by using the second photosensitive element, the first light ray emitted by the second light-emitting device being partially incident onto the first photosensitive element after being reflected by an external object. Thus, the display panel have both functions of brightness compensation and identification (e.g., fingerprint identification), and accuracy of brightness compensation and accuracy of fingerprint identification are both increased. For example, the first state is a display mode, and the second state is an identification mode. The operation method of the display panel may be adjusted according to a specific structure of the display panel. For the structure of the display panel, the related description in the foregoing embodiments may be referred to, and no details will be repeated here.

For example, in an operation method of a display panel provided by at least one embodiment of the present disclosure, in the second state, a first light-emitting device is controlled not to emit light. Thus, in an identification mode, the first light-emitting device is prevented from emitting a light ray that disturbs fingerprint identification.

In the disclosure, the following should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

The invention claimed is:

1. A display panel having a display side and a non-display side opposite to the display side, the display panel comprising:
   at least one first pixel region, comprising a first light-emitting device and a first photosensitive element, the first light-emitting device and the first photosensitive element being sequentially arranged in a direction from the display side to the non-display side; and
   at least one second pixel region, comprising a second light-emitting device and a second photosensitive element, the second light-emitting device and the second photosensitive element being sequentially arranged in the direction from the display side to the non-display side,
   wherein the second light-emitting device is configured to emit a second light ray to the non-display side, and the second photosensitive element is configured to allow the second light ray to be incident therein and detect the second light ray;
   wherein the first light-emitting device and the second light-emitting device are configured to emit a first light ray to the display side, and the first photosensitive element is configured to allow the first light ray reflected by an external object to be incident therein and detect the reflected first light ray; and the second light ray is of a type different from that of the first light ray;
   wherein the first light-emitting device comprises a first light-emitting drive upper electrode, a first light-emitting layer, and a first light-emitting drive lower electrode sequentially stacked from the display side to the non-display side; and the second light-emitting device comprises a second light-emitting drive upper electrode, a second light-emitting layer, and a second light-emitting drive lower electrode sequentially stacked from the display side to the non-display side;
   wherein the second light-emitting drive lower electrode is configured as a metal grating having a second polarization direction and configured to reflect light having a first polarization direction perpendicular to the second polarization direction; and the second light ray has the second polarization direction; and
   wherein the second photosensitive element comprises a metal grating having the second polarization direction that is provided on a side facing towards the second light-emitting device.

2. The display panel according to claim 1, wherein:
   the at least one first pixel region comprises a plurality of the first light-emitting devices and the first photosensitive element; and/or
   the at least one second pixel region comprises a plurality of the second light-emitting devices and the second photosensitive element.

3. The display panel according to claim 1, wherein the at least one first pixel region comprises a plurality of the first pixel regions, and the at least one second pixel region comprises a plurality of the second pixel regions, the plurality of the first pixel regions and the plurality of the second pixel regions are alternately arranged in a first direction of the display panel.

4. The display panel according to claim 1, wherein the first photosensitive element comprises a metal grating having the first polarization direction, the metal grating is provided on a side facing towards the first light-emitting device.

5. The display panel according to claim 1, wherein the second light-emitting drive upper electrode is configured as a metal grating having the first polarization direction; and the first light ray emitted by the second light-emitting device has the first polarization direction.

6. The display panel according to claim 1, wherein the first light-emitting drive upper electrode is configured as a metal grating having the first polarization direction; and the first light ray emitted by the second light-emitting device has the first polarization direction.

7. The display panel according to claim 1, wherein the first light-emitting drive lower electrode is configured as a metal grating having the first polarization direction.

8. The display panel according to claim 1, wherein a light ray emitted by the first light-emitting device faces away from the first photosensitive element.

9. The display panel according to claim 8, wherein the at least one first pixel region comprises a display portion and a non-display portion, the first light-emitting device is located in the display portion; the first light-emitting drive lower electrode is configured as a reflective electrode; and the first photosensitive element is at least partially located in the non-display portion or overlaps with an edge of the display portion in the direction from the display side to the non-display side.

10. The display panel according to claim 1, further comprising a first base substrate, wherein the first light-emitting device and the second light-emitting device are located on the first base substrate; a side of the first light-emitting device and the second light-emitting device that faces away from the first base substrate is the display side.

11. The display panel according to claim 10, wherein, the first photosensitive element and the second photosensitive element are located on the first base substrate; or the display panel further comprises a second base substrate located on a side of the first base substrate that faces away from the first light-emitting device; the first photosensitive element and the second photosensitive element are located on the second base substrate.

12. The display panel according to claim 1, further comprising a first base substrate, wherein the first light-emitting device and the second light-emitting device are located on the first base substrate; a side of the first base substrate that faces away from the first light-emitting device and the second light-emitting device is the display side.

13. The display panel according to claim 12, wherein:

the first photosensitive element and the second photosensitive element are located on the first base substrate; or the display panel further comprises a second base substrate located on a side of the first light-emitting device that faces away from the first base substrate; the first photosensitive element and the second photosensitive element are located on the second base substrate.

14. The display panel according to claim 1, wherein the first photosensitive element and the second photosensitive element comprise at least one of a photodiode and a phototransistor.

15. An operation method of a display panel, comprising:

in a first state, emitting light by a first light-emitting device and a second light-emitting device, and detecting a second light ray, emitted by the second light emitting device and then being incident onto a second photosensitive element, by using the second photosensitive element, a first light ray, emitted by the first light emitting device and the second light emitting device, forming a display image;

in a second state, emitting light by at least the second light-emitting device, and detecting the second light ray incident onto the second photosensitive element by using the second photosensitive element, the first light ray emitted by the second light-emitting device being partially incident onto the first photosensitive element after being reflected by an external object.

16. The operation method according to claim 15, wherein the first light-emitting device is controlled not to emit light in the second state.

* * * * *